United States Patent [19]

Ha

[11] Patent Number: 5,976,395
[45] Date of Patent: Nov. 2, 1999

[54] SELECTIVE ETCHING METHOD FOR STACKED ORGANIC FILM

[75] Inventor: Jae Hee Ha, Cheongju, Rep. of Korea

[73] Assignee: LG Semicon Co., Ltd., Cheongju, Rep. of Korea

[21] Appl. No.: 08/929,425

[22] Filed: Sep. 15, 1997

[30] Foreign Application Priority Data

Jan. 7, 1997 [KR] Rep. of Korea .......................... 97 163

[51] Int. Cl.⁶ ..................................................... H01L 21/00
[52] U.S. Cl. .............................. 216/67; 430/313; 430/325
[58] Field of Search ................................... 430/313, 325, 430/323; 216/67

[56] References Cited

U.S. PATENT DOCUMENTS

| | | | |
|---|---|---|---|
| 5,240,554 | 8/1993 | Hori et al. | 156/643 |
| 5,271,800 | 12/1993 | Koontz et al. | 156/643 |
| 5,302,240 | 4/1994 | Hori et al. | 156/643 |
| 5,632,910 | 5/1997 | Nagayama | 216/47 |
| 5,679,499 | 10/1997 | Yamamori | 430/56 |
| 5,807,790 | 9/1998 | Gupta et al. | 438/725 |

*Primary Examiner*—Bruce Breneman
*Assistant Examiner*—Rudy Zervignon
*Attorney, Agent, or Firm*—Fleshner & Kim

[57] ABSTRACT

A selective etching method for a stacked organic film which is capable of effectively removing an organic anti-reflection layer without a loss of a photoresist film before etching a base layer such as a wafer, etc., by using an organic anti-reflection layer. The method includes the steps of forming a first organic film on a base layer, forming a second organic film on the first organic film, patterning the second organic film, and exposing a predetermined portion of the first organic film, hardening the first organic film and the patterned second organic film, and etching the exposed first organic film and exposing the base layer.

14 Claims, 2 Drawing Sheets

SELECTIVE ETCHING METHOD FOR STACKED ORGANIC FILM

BACKGROUND OF THE INVENTION

1. Field of the Invention

The present invention relates to a selective etching method for a stacked organic film, and in particular to an improved selective etching method for a stacked organic film which is capable of effectively removing an organic anti-reflection layer without a loss of a photoresist film before etching a base layer such as a wafer, etc., by using an organic anti-reflection layer.

2. Description of the Conventional Art

Recently, during the etching process for fabricating a semiconductor device, an anti-reflection bottom organic layer is increasingly used in order to increase the depth of an optical focus (DOF) and resolution at the time of using an i-Line/DUV (Deep UV) photoresist (PR) film.

The composition of a commercially-used organic anti-reflection layer is different based on the fabrication company and the kind of a photoresist (PR) film, but includes aromatic agents of which carbon is a major element. The etching characteristic of a bottom organic anti-reflection layer is very similar to the etching characteristic of the photoresist film. In particular, an isotropic etching profile may be formed under an oxygen ($O_2$) plasma at room temperature due to a chemical etching characteristic of a photoresist film and bottom organic layer, which characteristic is directed to forming a main product of $CO_2$ without using gas, for thus causing a large critical dimension (CD) bias. Therefore, in the conventional art, $N_2$, Ar, $SO_2$, etc. or $CF_4$, $CHF_3$, $C_2F_6$, etc. which are compound gases including fluorine are added, and then the organic anti-reflection layer is etched. A polymer such as $CN_x$, $CS_x$, $CF_x$, $CHF_x$, etc is formed at a sidewall of the organic anti-reflection layer which remains after the etching process, and the anisotropic etching profile of the organic anti-reflection layer is maintained, and the residual organic anti-reflection layer and a critical dimension (CD) bias of the photoresist layer are minimized.

FIGS. 1A through 1C illustrate a conventional selective etching method of a stacked organic film.

As shown in FIG. 1A, a first organic film 13 such as an organic anti-reflection layer is coated on the upper surface of a base layer 11 which becomes an etching object layer, and a second organic film 15 such as a photoresist film patterned for etching the base layer 11 is formed on the upper surface of the first organic film 13. The thusly patterned second organic film 15 is used as a mask at the time of etching the base layer 11. As shown in FIG. 1B, a passivation gas such as $CF_4$, $CHF_3$, $N_2$, etc. is added into an $O_2$ plasma before the base layer 11 is etched. However, at this time, the second organic film 15 is etched and eroded together with the first organic film 13, and the second organic film 15 is changed to a triangle-shaped second organic film 15a. A sidewall passivation film 17 is formed on sidewalls of the first organic film 13a formed below the second organic film 15a by $CF_4$, $CHF_3$, $N_2$, etc. Thereafter, as shown in FIG. 1C, the base layer 11 is etched by using the second organic film 15a as a mask, and then the first organic film 13a including the second organic film 15a and the sidewall passivation film 17 are removed, for thereby finishing the etching process. The anisotropic etching profile of the first organic film is maintained by the sidewall passivation film 17, and the critical dimension biases of the first organic film 13a and the second organic film 15a are minimized. However, since the etching speed ratio between the second organic film 15 and the first organic film 13 is similar, the second organic film 15 is eroded together with the first organic film 13 at the time of etching the first organic film 13, so that the etching is first performed at a corner portion of the same, for thus forming a much deformed profile of the second organic film 15a. Therefore, when etching the base layer 11 by using the deformed second organic film 15a as a mask, as shown in FIG. 1C, a narrowed upper portion, widened lower portion and sloped pattern of the base layer 11a is formed.

The problems of the conventional selective etching method for a stacked organic film will now be explained.

First, when etching the first organic film such as an organic anti-reflection layer, an ion sputtering effect is increased due to heavy gases having a large molecular structure such as $SO_2$, $CHF_3$, $C_2F_6$, etc., whereby the second organic film such as the photoresist film is severely eroded. Therefore, when etching the base layer (the etching object layer) by using the thusly deformed second organic film as a mask, it is impossible to maintain a desired profile of the base layer.

Second, since the etching speed ratio between the second organic film and the first organic film is similar, the loss of the second organic film is much increased at the time of etching the first organic film. Therefore, when etching the base layer, since the second organic film does not play the role of a mask, the base layer may be attacked.

Third, since an organic polymer (sidewall passivation film) such as $CF_x$, $CHF_x$, etc. is formed on the base layer, the sidewall passivation film acts as a barrier at the time of etching the base layer.

SUMMARY OF THE INVENTION

Accordingly, it is an object of the present invention to provide a selective etching method for a stacked organic film which overcomes the aforementioned problem encountered in the conventional art.

It is another object of the present invention to provide an improved selective etching method for a stacked organic film which is capable of effectively removing an organic anti-reflection layer without a loss of a photoresist film before etching a base layer such as a wafer, etc., by using the organic anti-reflection layer.

To achieve the above objects, there is provided a selective etching method for a stacked organic film which includes a first organic film on a base layer, a patterned second organic film on the first organic film, and exposing a predetermined portion of the first organic film, which method includes hardening the first organic film and the patterned second organic film, and etching the exposed first organic film and exposing the base layer.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The selective etching method for a stacked organic film according to the present invention will now be explained with reference to FIGS. 2A through 2C.

Figure 1A:
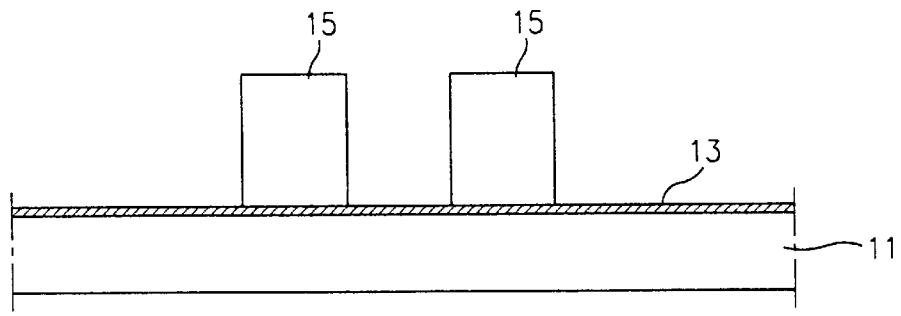
FIGS. 1A through 1C are vertical cross-sectional views illustrating a conventional selective etching method of a stacked organic film.
Figure 1B:
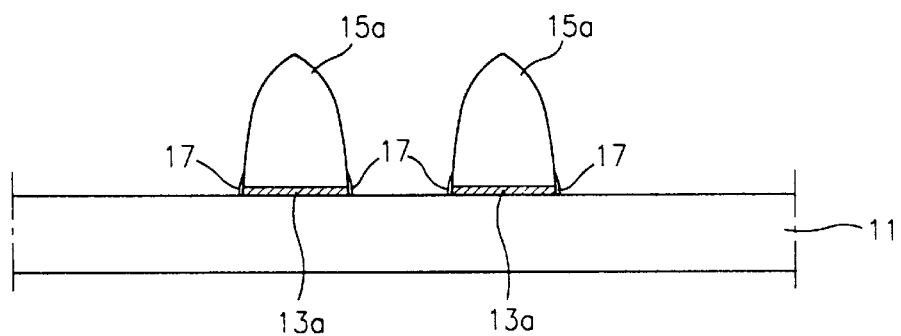
Figure 1C:
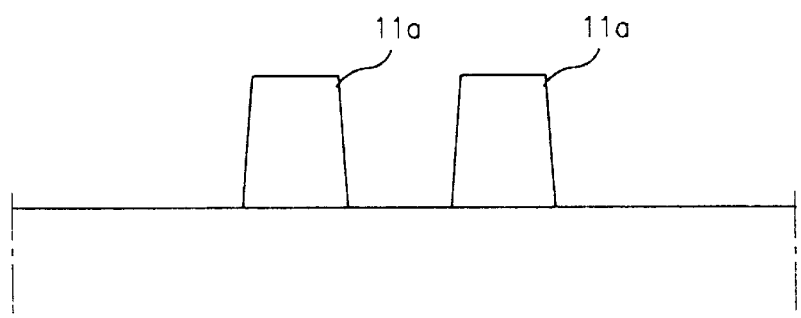
Figure 2A:
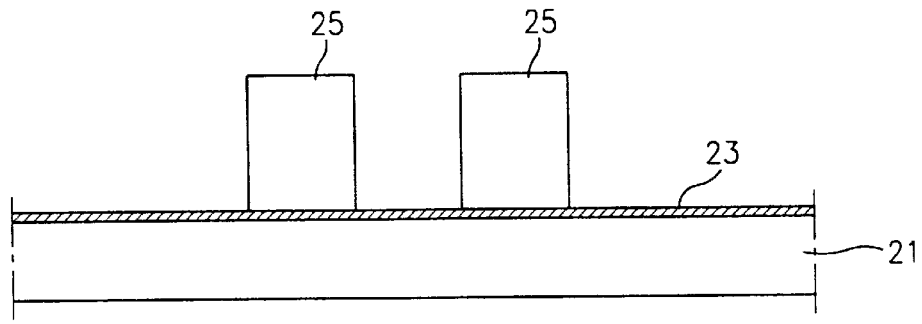
FIGS. 2A through 2C are vertical cross-sectional views illustrating a selective etching method for a stacked organic film according to the present invention.
Figure 2B:
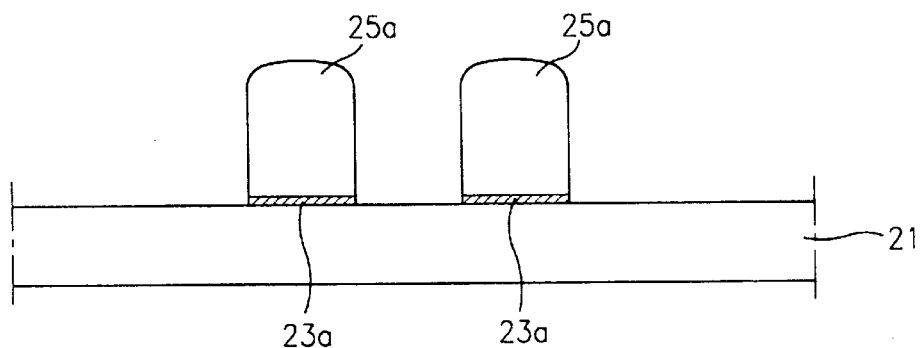

First, as shown in FIG. 2A, a first organic film 23 such as an organic anti-reflection layer is coated on the upper surface of a base layer 21 which becomes an etching object layer, and a patterned second organic film 25 is formed on the upper surface of the first organic film 23. The patterned second organic film 25 is formed of a photoresist film and is used as a mask at the time of etching the base layer 21. As shown in FIG. 2B, a helium plasma is generated in a dry etching apparatus (not shown) such as an RIE (Reactive Ion Etch) type apparatus, an MERIE (Magnetically Enhanced Reactive Ion Etch) type apparatus, an ICP (Inductively Coupled Plasma) type apparatus, etc., and the resultant structure is hardened in the helium plasma, and a gas compound plasma containing oxygen ($O_2$) is generated In-situ. The first organic film 23 is etched by using the gas compound plasma, so that first organic film 23a formed below the second organic film 25a remains, and the remaining portion of the first organic film 23 is removed. At this time, the thusly hardened second organic film 25 remains as a profile of the second organic film 25a in which only an upper portion of the same is slightly etched. In addition, when processing the helium plasma using the ICP type apparatus, the bias power is controlled at below 100 W, and the resultant structure is preferably processed in a helium plasma condition for about 3 minutes.

Figure 2C:
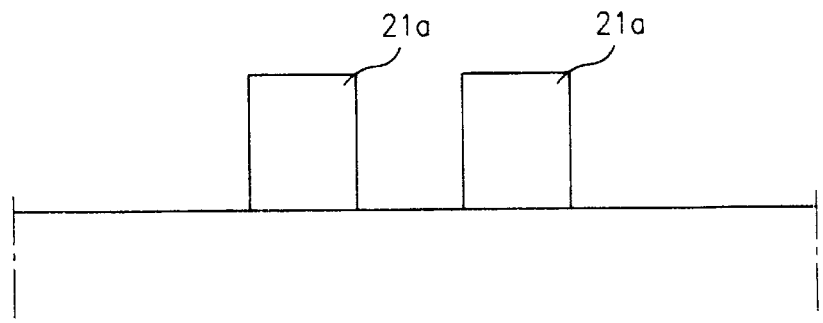

As shown in FIG. 2C, the base layer 21 is etched by using the second organic film 25a as a mask, and then the second organic film 25a and the first organic film 23a are removed, so that the etching process with respect to the base layer 21 is finished. The thusly etched and patterned base layer 21a has a non-sloped profile.

In addition, when performing the helium plasma process for about 3 minutes, the photoresist film is deformed in thickness by as much as about 267 Å, and the organic anti-reflection layer is deformed in thickness as much as about 125 Å. After finishing the helium plasma process, when the etching process of the organic anti-reflection layer is performed, the etching speed of the organic anti-reflection layer is about 2184 Å/min, and the etching selection ratio between the organic anti-reflection layer and the photoresist film is 1.7:1. Namely, the etching speed selection ratio of the organic anti-reflection layer is about two times compared with the photoresist film.

In addition, when performing an argon (Ar) plasma process for about 3 minutes, the photoresist film is deformed in thickness as much as about 1295 Å, and the organic anti-reflection layer is deformed in thickness as much as about 75 Å. After the argon plasma process is finished, when the etching process of the organic anti-reflection layer is performed, the etching speed of the organic anti-reflection layer is about 2751 Å/min, and the etching selection ratio of the organic anti-reflection layer and the photoresist film is 0.87:1.

As described above, in the etching method for an organic film according to the present invention, since additional equipment is needed for hardening the second organic film (photoresist film), the In-situ process is performed by using the same apparatus as the etching apparatus, resulting in low cost. In addition, the etching speed selection ratio of the first organic film (organic anti-reflection layer) with respect to the second organic film (photoresist film) can be increased up to two times at the time of etching the first organic film (organic anti-reflection layer) by using the oxygen ($O_2$) plasma. Since the second organic film (photoresist film) is more effectively hardened, the erosion phenomenon of the second organic film (photoresist film) is significantly prevented at the time of etching the first organic film (organic anti-reflection layer), so that it is possible to maintain a non-sloped state of the profile of the base layer at the time of etching the base layer.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A selective etching method for a stacked organic film including a first organic film formed on a base layer, and a patterned second organic film formed on the first organic film and exposing a portion of the first organic film, comprising the steps of:

hardening the first organic film and the patterned second organic film, wherein said hardening is directed to hardening the second organic film more than the first organic film and performed using one of a RIE (Reactive Ion Etch) apparatus and an ICP (Inductively Coupled Plasma) etching apparatus and a bias power is adjusted to be below 100 W; and etching the exposed first organic film and exposing the base layer, wherein a helium plasma generation process is performed concurrently with the hardening.

2. The method of claim 1, wherein said hardening is performed by using a helium plasma.

3. The method of claim 1, wherein said hardening is performed such that an etching speed of the first organic film exposed after the hardening is faster than that of the second organic film.

4. The method of claim 1, wherein said etching with respect to the first organic film is performed In-situ after the hardening is performed.

5. The method of claim 1, wherein said etching with respect to the first organic film is performed by using a gas compound plasma containing oxygen ($O_2$).

6. The method of claim 5, wherein in said etching, an etching speed of the first organic film is faster by about two times than that of the second organic film.

7. A selective etching method for semiconductor devices, comprising the steps:

a) forming a first organic layer on top of a base layer having a first etching speed;

b) forming a patterned second organic layer on top of a portion of said first organic layer having a second etching speed;

c) altering an etching speed ratio between said first and second organic layer; and d) etching an exposed portion of said first organic layer and exposing the base layer, wherein said etching and said alteration of the etching speed ratio is performed in-situ by a single apparatus.

8. The selective etching method of claim 7, wherein said first organic layer is an anti-reflection bottom layer and said second organic layer is a photoresist layer.

9. The selective etching method of claim 7, wherein said second etching speed is altered to be slower than said first etching speed.

10. The selective etching method of claim 7, wherein said fist etching speed is altered to be approximately twice as fast as said second etching speed.

11. The selective etching method of claim 7, wherein said etching speed ratio is altered by exposing said first and second organic layers to a helium plasma for approximately 3 minutes.

12. The method of claim 1, wherein the first organic film is etched with a gas compound plasma containing oxygen ($O_2$) which is generated in-situ.

13. The method of claim 12, wherein a single in-situ apparatus is used for the hardening and etching.

14. The method of claim 1, wherein the hardening by exposure to a helium plasma continues for approximately three (3) minutes.

* * * * *